United States Patent
Wang et al.

(10) Patent No.: US 7,332,449 B2
(45) Date of Patent: Feb. 19, 2008

(54) METHOD FOR FORMING DUAL DAMASCENES WITH SUPERCRITICAL FLUID TREATMENTS

(75) Inventors: Ching-Ya Wang, Taipei (TW); Joshua Tseng, Ban-Shan County (TW); Henry Lo, Hsinchu (TW); Jean Wang, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 134 days.

(21) Appl. No.: 11/240,965

(22) Filed: Sep. 30, 2005

(65) Prior Publication Data
US 2007/0241455 A1   Oct. 18, 2007

(51) Int. Cl.
*H01L 21/302* (2006.01)
*H01L 21/461* (2006.01)
*H01L 21/44* (2006.01)

(52) U.S. Cl. .................. 438/963; 438/704; 438/745; 438/672; 257/774; 257/E23.145

(58) Field of Classification Search ............... 438/963, 438/725, 704, 745, 637, 672, 63; 257/774, 257/E23.145
See application file for complete search history.

(56) References Cited

U.S. PATENT DOCUMENTS

| 6,500,605 | B1 * | 12/2002 | Mullee et al. | 430/329 |
| 6,780,761 | B1 * | 8/2004 | Wu et al. | 438/637 |
| 2007/0054823 | A1 * | 3/2007 | Daviot | 510/201 |
| 2007/0138640 | A1 * | 6/2007 | Chakrapani et al. | 257/758 |

* cited by examiner

*Primary Examiner*—Nitin Parekh
(74) *Attorney, Agent, or Firm*—Thomas, Kayden, Horstemeyer & Risley

(57) ABSTRACT

A method for forming a damascene structure by providing a single process solution for resist ashing while avoiding and repairing plasma etching damage as well as removing absorbed moisture in the dielectric layer, the method including providing a substrate comprising an uppermost photoresist layer and an opening extending through a thickness of an inter-metal dielectric (IMD) layer to expose an underlying metal region; and, carrying out at least one supercritical fluid treatment comprising supercritical $CO_2$, a first co-solvent, and an additive selected from the group consisting of a metal corrosion inhibitor and a metal anti-oxidation agent to remove the uppermost photoresist layer, as well as including an optional dielectric insulating layer bond forming agent.

15 Claims, 4 Drawing Sheets

METHOD FOR FORMING DUAL DAMASCENES WITH SUPERCRITICAL FLUID TREATMENTS

FIELD OF THE INVENTION

This invention generally relates to integrated circuit manufacturing of multi-layered semiconductor devices and more particularly to a method for forming dual damascene structures with reduced plasma damage and improved low-K dielectric insulating properties using supercritical fluid treatments.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low resistance and capacitance interconnect properties, particularly where submicron inter-layer damascene interconnects (e.g., vias) and intra-layer interconnects having increasing large aspect ratios (narrow openings).

In particular, in forming a dual damascene by a via-first method where the via opening is first formed in one or more dielectric insulating layers followed by forming an overlying an encompassing trench opening for forming a metal interconnect line, several critical processing steps are required which entail exposing the low-K dielectric insulating layers to plasma assisted etching or ashing chemistries to etch openings and to remove photoresist layers.

For example, silicon oxide based low-K dielectric insulating layers have exhibited a tendency to interact with etching plasma to detrimentally affect the low-K dielectric insulating layer including increasing a dielectric constant as well as making it hydrophilic and more susceptible to moisture absorption during subsequent processing steps.

Approaches in the prior art to overcome some of these shortcomings has been to institute time-consuming baking processes to drive absorbed moisture out of the low-K dielectric insulating layer following wet cleaning and metal plating steps, such as copper electrochemical deposition (ECD). Other approaches have been to introduce a capping or protective layer over the dielectric insulating layer which also contributes to undesirably increased dielectric constants and capacitances but which does not protect a dielectric insulating layer with etched openings from degradation.

Problems with prior art approaches include the necessity of complicated etching, wet cleaning, and baking steps to overcome the problems of contamination and moisture (water) absorption in the dielectric insulating layer.

There is therefore a need in the semiconductor processing art to develop an improved dual damascene manufacturing process whereby the integrity and properties of dielectric insulating layers are improved while reducing a number of processing steps to achieve greater throughput.

It is therefore an object of the invention to provide an improved dual damascene manufacturing process whereby the integrity and properties of dielectric insulating layers are improved while reducing a number of processing steps to achieve greater throughput, in addition to overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a damascene structure by providing a single process solution for resist ashing while avoiding and repairing plasma etching damage as well as removing absorbed moisture in the dielectric layer.

In a first embodiment, the method includes providing a substrate comprising an uppermost photoresist layer and an opening extending through a thickness of an inter-metal dielectric (IMD) layer to expose an underlying metal region; and, carrying out at least one supercritical fluid treatment comprising supercritical CO2, a first co-solvent, and an additive selected from the group consisting of a metal corrosion inhibitor and a metal anti-oxidation agent to remove the uppermost photoresist layer, as well as including an optional dielectric insulating layer bond forming agent.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

While the method of the present invention is explained with exemplary reference to, and is particularly advantageous in the formation of a copper filled dual damascene structure, it will be appreciated that the method is applicable with the use of other metals, for example tungsten, aluminum, copper, or alloys thereof. It will further be appreciated that the method may be applicable to dual damascenes with or without middle etch stop layers formed between dielectric insulating layers to separate a via portion and trench line portion of the dual damascene. For example a single dielectric insulating layer may include both the via portion and the trench portion of the dual damascene structure.

Figure 1A:
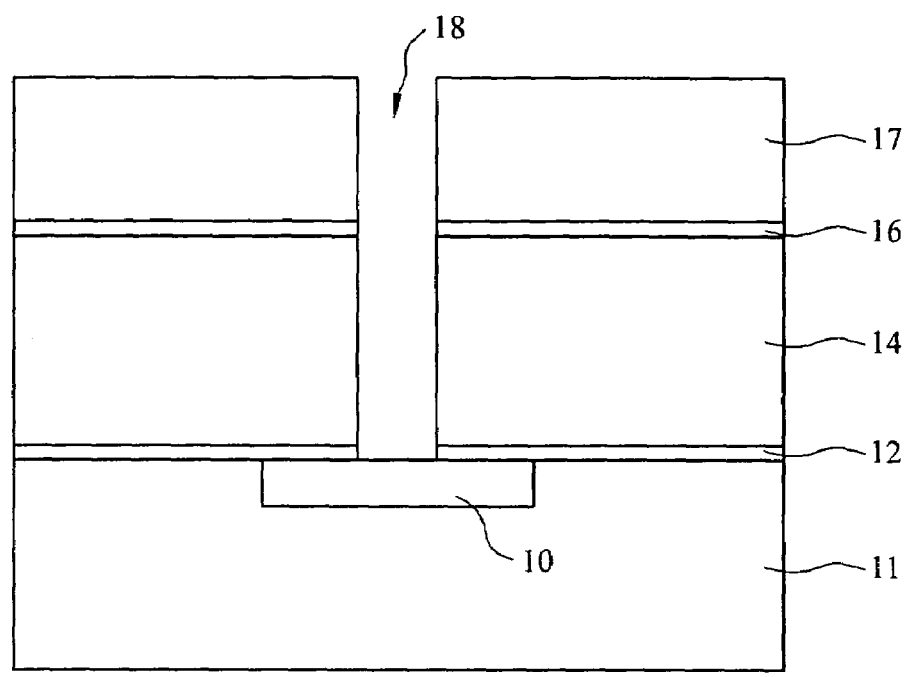
FIGS. 1A-1F are exemplary cross sectional views of a dual damascene structure stages in manufacturing process including the method according to an embodiment of the present invention.

For example, in an exemplary embodiment, referring to FIGS. 1A-1F, are shown schematic cross sectional views of a portion of a multi-level semiconductor device at stages in a dual damascene manufacturing process. Referring to FIG. 1A is shown a conductive region 10, for example, copper, formed in a dielectric insulating layer 11 having an overlying first etch stop layer 12, for example, silicon nitride (e.g., SiN), silicon oxynitride (e.g., SiON), silicon carbide (SiC), oxygen doped silicon carbide (e.g., SiOC), or nitrogen doped silicon carbide (e.g., SICN). First etching stop layer 12 is formed by a conventional chemical vapor deposition (CVD) process including low pressure CVD (LPCVD) or plasma enhanced CVD (PECVD) process at a thickness of about 300 Angstroms to about 700 Angstroms.

Still referring to FIG. 1A, formed over etching stop layer 12 is first dielectric insulating layer 14, also referred to as an inter-metal dielectric (IMD) layer formed of preferably a low-K (low dielectric constant) silicon oxide based material, for example, including carbon doped silicon oxide or organo-silicate glass (OSG) formed by PECVD methods. In addition, the dielectric insulating layer 14 may be formed of inorganic or organic spin-on dielectrics (SOD) such as silsesquioxanes including methyl silsesquioxane formed by conventional spin-on processes. Preferably the low-K IMD layer 14 has a dielectric constant of less than about 3.0, more preferably less than about 2.8 and has an interconnecting porous structure. Typically, the IMD layer 14 is formed having a thickness of about 3000 to about 7000 Angstroms.

Still referring to FIG. 1A, following deposition of the IMD layer 14, an etch stop/BARC layer 16 is optionally formed over the IMD layer 14, preferably an inorganic material that functions as both an etch stop and BARC layer. For example, silicon oxynitride and silicon oxycarbide are preferably used as a BARC/etch stop layer where the layer also functions as an etch stop or hardmask layer to improve subsequent RIE etching profiles. It will be appreciated that a conventional etch stop layer such as silicon nitride and an overlying inorganic BARC layer such as silicon oxynitride or an organic BARC layer may be used in place of a single BARC/etch stop layer 16.

Still referring to FIG. 1A, a photoresist layer 17 is formed over the BARC layer and patterned by conventional photolithographic patterning processes for etching a via opening. A via opening 18 is then formed by plasma assisted etching process including fluorocarbons and/or perfluorocarbons, for example a reactive ion etch (RIE) process. In an important aspect of the present invention the underlying conductive region e.g., copper region 10 is exposed during the via etching process by etching completely through a thickness of the etch stop layer 12.

Figure 1B:
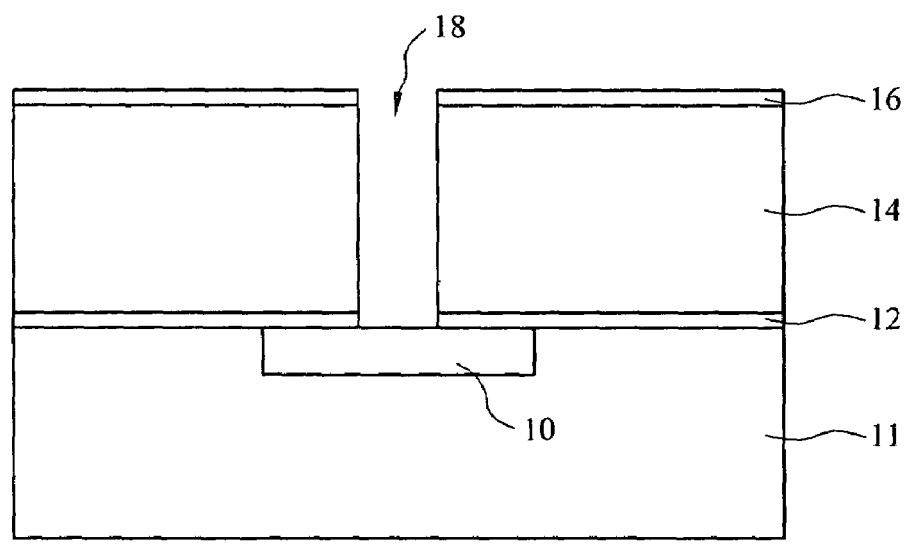

Referring to FIG. 1B, the photoresist layer 17 is then removed by a first supercritical fluid treatment. The first supercritical fluid treatment is preferably carried out including a metal, e.g. copper, corrosion inhibitor, to treat the exposed metal portion at the via opening bottom. The metal corrosion inhibitor prevents metal corrosion during the first supercritical fluid cleaning process. The first supercritical fluid treatment also preferably includes on or more co-solvents to remove the via patterning resist layer 17. For example, the first supercritical fluid treatment may be used to remove the photoresist layer 17 and simultaneously carrying a metal corrosion inhibitor and a metal anti-oxidation agent onto an exposed underlying metal region. The supercritical fluid treatment may also be used to remove moisture and carry repairing agents into dielectric film.

Preferably, the metal corrosion inhibitor additive may be a copper corrosion inhibitor such as one or more of imidazole, tolytrizole, or thiourea. For example, the copper corrosion inhibitor may be added at a weight percent of about 0.1 wt % to about 5 wt %, preferably less than about 1 wt % with respect to the supercritical fluid , e.g., $CO_2$ and one or more co-solvents.

In addition, an anti-oxidation additive (passivation agent) such as one or more of benzotriazole (BTA) and mercaptobenzothiazole (MBT) may be added during at least a portion of the supercritical fluid treatment at the same wt % ranges as outlined for the copper corrosion inhibitor. It will be appreciated that the first supercritical fluid treatment may include solvents as outlined below for removing the trench patterning resist to remove the via patterning resist layer simultaneously or separately from the supercritical treatment including copper corrosion inhibitors and copper anti-oxidation additives.

Advantageously, according to the present invention, the copper corrosion inhibitors and copper anti-oxidation (Cu passivation) additives are efficiently delivered to into high aspect ratio vias e.g., greater than about 4:1, by the supercritical fluid treatment due to the relative absence of surface tension effects compared to prior art treatments. In addition, by adding the copper corrosion inhibitors and copper anti-oxidation (Cu passivation) additives together with one or more co-solvents such as acids, amines and phenols included in the supercritical fluid treatment for removing resist, the exposed copper feature at the via bottom is protected from corrosion (erosion) and oxidation during the supercritical fluid treatment.

The supercritical fluid treatment is carried out at conventional temperatures and pressures above a critical point to form a supercritical fluid (medium). For example, $CO_2$ forms a supercritical state when the temperature and pressure is above a critical point. For example, a supercritical fluid precursor including $CO_2$ and the methoxy containing co-solvent is heated from about 25° C. to about 85° C. at a pressure from about 2000 psig to about 8000 psig to form a supercritical medium (fluid). More preferably, the supercritical fluid is formed by heating a fluid precursor at a temperature from about 30° C. to about 70° C. at a pressure of about 2500 psig to about 4000 psig. For example, the supercritical fluid is formed to have a viscosity on the order of $10^{-2}$ to $10^{-4}$ poise and a density of about 600 to about 800 $kg/m^3$. Methods of forming supercritical fluids are known in the art including supercritical reactors having means for controlling pressure and temperature. For example, the $CO_2$ may be added to the reactor chamber in liquid form with selected additives and solvents or co-solvents added to the liquid $CO_2$ before or after the liquid $CO_2$ is introduced into the reactor. The treatment may carried out for varying time periods, for example from about 2 minutes to about 45 minutes depending on the composition and prior processes the dielectric insulating layer has been subjected to.

Figure 1C:
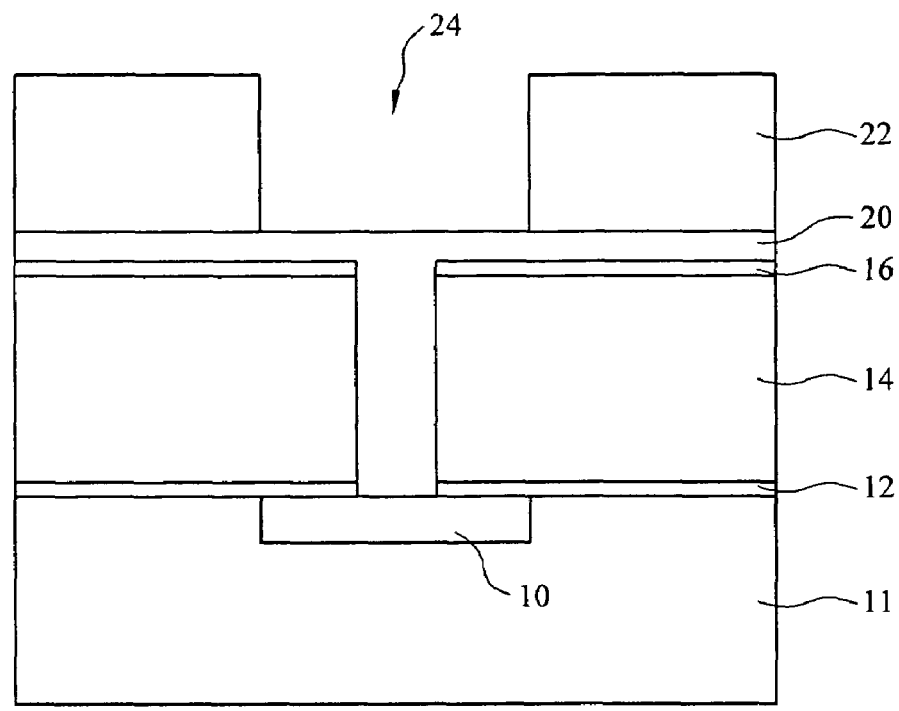

Referring to FIG. 1C, following the first super critical fluid treatment including copper anti-oxidation agents and copper corrosion inhibitors, a resinous plug layer 20 is formed. For example, a conventional photoresist resin or a photoresist resin, such as a negative photoresist or a photoresist resin without photoactive additives, may be used to for the plug layer to avoid the necessity of an oxygen containing etchback process prior to depositing an overlying trench patterning photoresist layer 22. It will be appreciated that the resinous plug layer 20 may first be etched back to remove the layer overlying the etch stop/BARC layer upper surface 16 prior to forming overlying trench patterning photoresist layer 22. The resinous plug layer 20 is preferably deposited by a spin-on method to including filling the via opening 18.

Still referring to FIG. 1C, a photoresist (e.g., positive) layer 22 is then blanket deposited over the resinous plug layer 20. A conventional photolithographic patterning process is then carried by conventional processes to pattern a trench opening etching pattern (opening) 24 overlying and encompassing via opening 18. It will be appreciated that trench line opening pattern e.g. 24 may encompass more than one via opening.

Figure 1D:
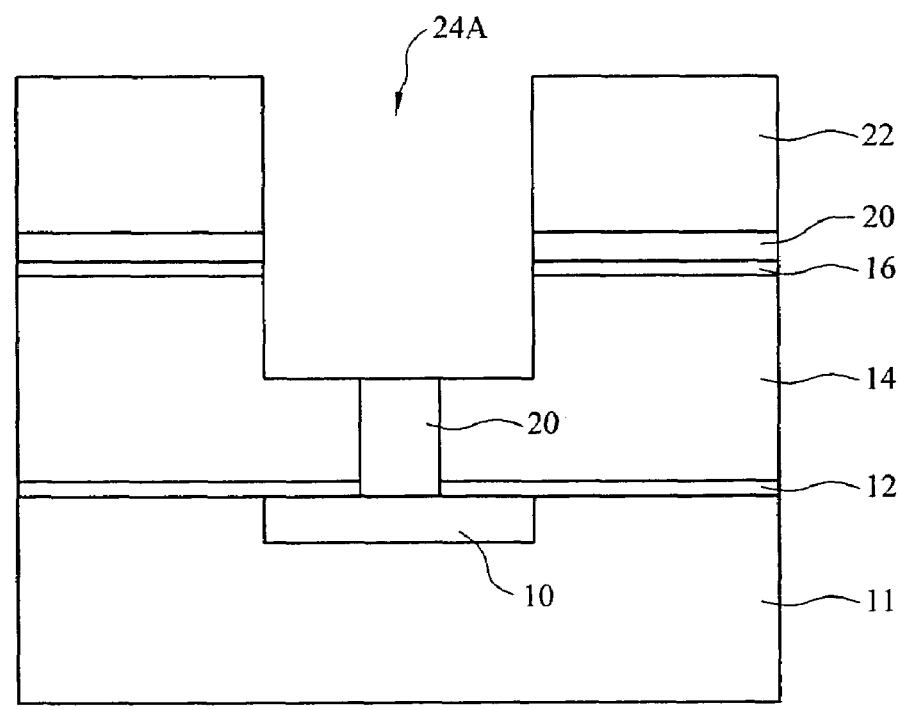

Referring to FIG. 1D, following the trench opening patterning process, a conventional dry etching process is carried out to etch through the resinous plug layer 20, the BARC/etch stop layer 16, and through a thickness portion of the IMD layer 14 to form a trench opening 24A. During the dry etching process the resinous plug layer 20 is simultaneously etched back to remain substantially filling the via portion.

Figure 1E:
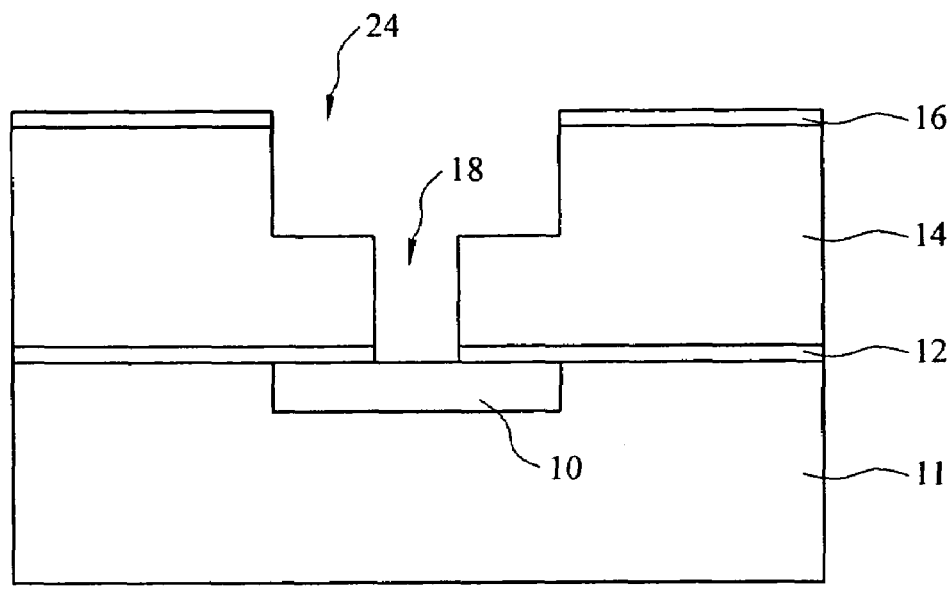

Referring to FIG. 1E, in an important aspect of the invention, following formation of trench opening 20, a second supercritical fluid treatment is carried out to remove the remaining portion of the resinous plug layer 20 and the photoresist layer 22 to complete formation of the dual damascene opening. Preferably, a co-solvent capable of solvating resist and the resinous plug material is added to the supercritical fluid either before or during the super critical fluid treatment. The co-solvent may be any co-solvent capable of solvating the photoresist at supercritical temperatures and pressures, but exemplary solvents include acids, amines and phenols as well as ketones, halogenated hydrocarbons, sulfonic acids, pyrrolidones, glycol ethers, esters, sulfur oxides, and carboxylic acids at a weight percent of about 3 weight percent to about 20 weight percent with respect to the total weight percent of the supercritical fluid. The co-solvent used for removing the trench patterning resist layer and plug layer may be the same or different than the co-solvent previously used in the first super-critical fluid treatment including removing a via patterning resist layer in the via forming process.

The supercritical fluid may additionally include conventional surface active agents (surfactants) in the amount of about 0.1 weight % to about 3 weight % with respect to the total weight percent of the supercritical $CO_2$ containing medium. The addition of a surface active agent to the supercritical $CO_2$ containing medium is believed to advantageously aid removal of chemical residues and water.

In an important aspect of the second supercritical fluid treatment, copper anti-corrosion inhibitors and copper anti-oxidation agents as previously outlined for the first super critical fluid treatment are preferably included in the supercritical fluid medium for carrying out the second supercritical fluid treatment.

Following the second supercritical fluid treatment to remove the resinous plug layer 20 and the photoresist layer 22, in an important aspect of the invention, a third supercritical fluid treatment is carried out to increase a density of the Si—O—Si bonds in exposed IMD layer portions IMD layer (e.g., dual damascene opening sidewalls). Preferably an additive is included in the third supercritical fluid treatment to enhance the formation of Si—O—Si bonds in the IMD layer 14, thereby increasing a density of the IMD layer including at near surface regions of exposed portions of the IMD layer. For example, the additive, also referred to herein as a bond forming agent, preferably promotes IMD layer silanol (SiOH) condensation reactions, to thereby increase the number of S—O—Si bonds in the IMD layer, thereby increasing a density of the IMD layer. It will be appreciated that the third supercritical fluid treatment may be carried out following the first supercritical fluid treatment or be coextensive with the first and second supercritical fluid treatments, e.g., by adding the bond forming agent during a portion of the first and second supercritical fluid treatments.

Suitable exemplary additives include alkyl substituted silanes including Si—$CH_3$ terminal bonding groups, such as R—Si$(CH_3)_xH_y$ where x+y=3, and where R is an organic substituent such as alkyl, hydroxyalkyl, phenyl, alkylphenyl, hydroxyalkylphenyl, alkanol, or amine group. For example, alkyl amine silanes or alkyl amino silanes including trimethyl amino silanes or trimethyl amine silanes including $(CH_3)_3$Si—$NH_2$ or $(CH_3)_3$Si—NH—Si$(CH_3)_3$ are specific examples of suitable Si—O—Si bond forming additives. Preferably, the preferred additives have a combined weight percent of about 5 to about 20 weight percent with respect to the total weight of the supercritical fluid. Advantageously, it has been found that treating the IMD layer 14 including the dual damascene opening with the preferred supercritical fluid treatment has the desirable effect of lowering the dielectric constant, for example to a level approaching a pre-etching/ashing level.

For example, it is believed that the third supercritical fluid treatment repairs dangling SiOH bonds at the IMD layer surface including promoting silanol (SiOH) condensation reactions to form a higher density of Si—O—Si bonds at exposed IMD layer surface portions (e.g., dual damascene opening sidewalls). In addition, the supercritical fluid treatment allows penetration into an IMD layer having an interconnecting porous structure, thereby allowing the Si—O—Si forming reaction to take place in the interior of the IMD layer, the extent of penetration dependent on the treatment temperature, time, the porous structure, and the viscosity of the supercritical fluid medium. In addition, the third supercritical fluid treatment has the added effect of removing etching contaminants bonded to silicon such as fluorine and nitrogen as well as removing moisture from the IMD layer portion exposed to the treatment, making the IMD layer hydrophobic and thereby avoiding the necessity of a subsequent thermal baking treatment to remove water according to prior art processes. It will be appreciated that surfactants, copper anti-corrosion inhibitors and copper anti-oxidation agents as previously outlined for the first second super critical fluid treatment may be included in the supercritical fluid medium for carrying out the third super critical fluid treatment.

Figure 1F:
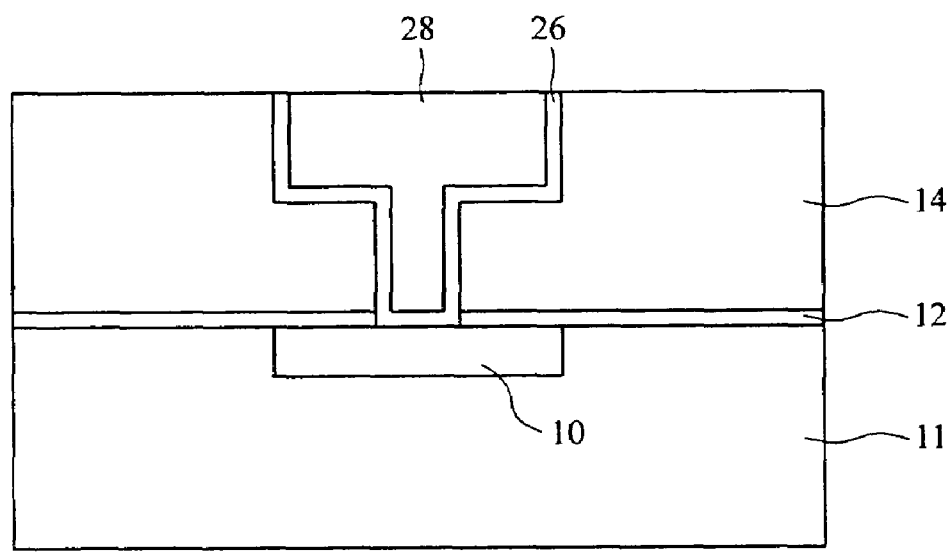

Referring to FIG. 1F, conventional processes are then carried out to complete the formation of the dual damascene including forming a barrier layer 26, e.g., TaN, lining the dual damascene opening, backfilling with copper layer 28 by an electrochemical deposition (ECD) process, and a CMP planarization process to expose the IMD layer 14 surface.

Thus, according to the present invention, a dual damascene process has been introduced that avoids damage to an IMD layer including a dual damascene opening as well as preserving a low dielectric constant of a silicon oxide based low-K integrity. In addition, the present invention reduces the number of prior art processing steps and eliminates required process tools, for example avoiding the necessity of plasma ashing processes, wet cleaning processes, and thermal baking processes. By carrying out the supercritical fluid treatments according to preferred embodiments, the quality of wiring interconnects including dual damascenes in improved as well as improving the device performance and reliability of a completed semiconductor device.

Figure 2:
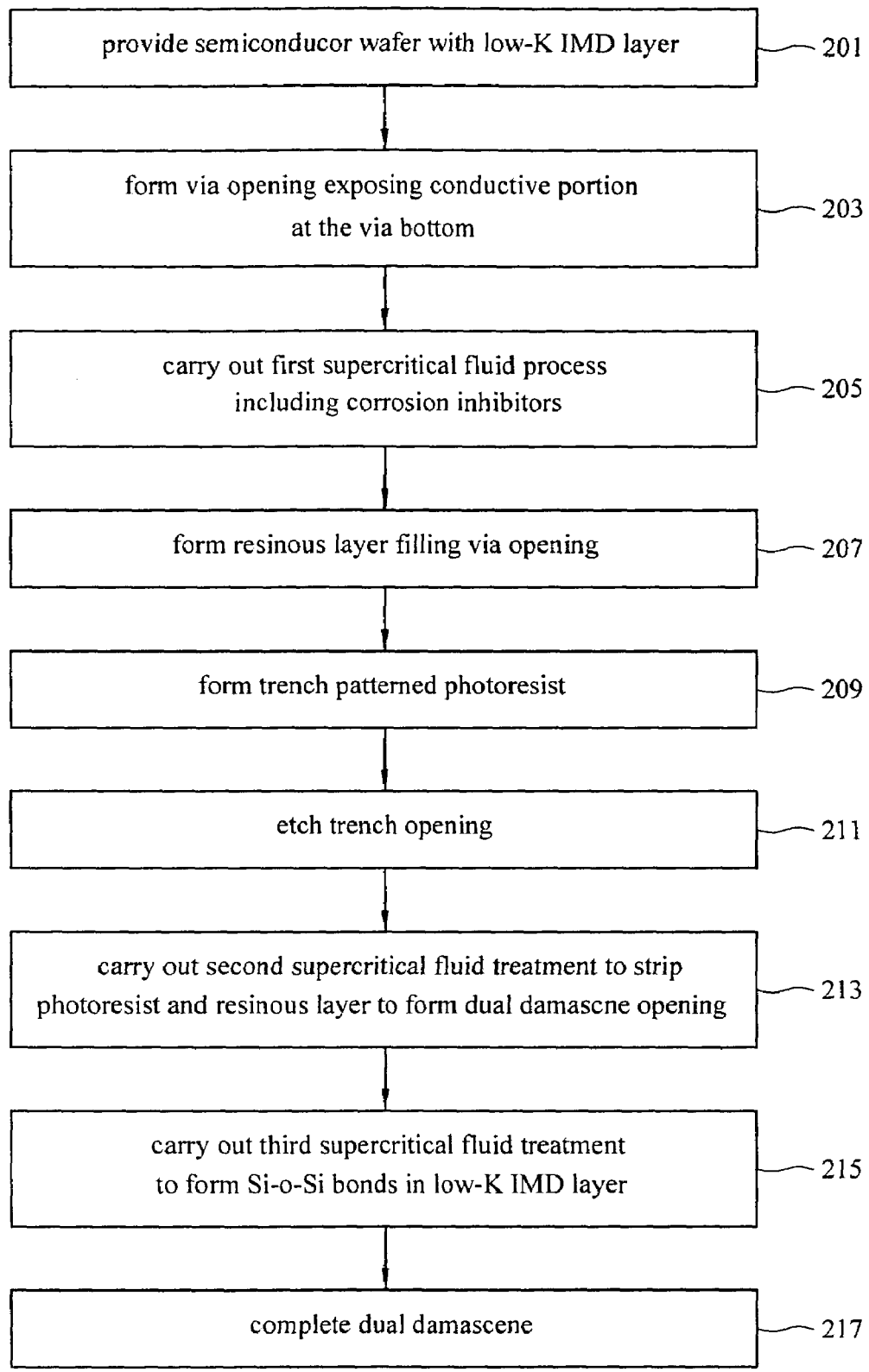
FIG. 2 is a process flow diagram including several embodiments of the method of the present invention.

Referring to FIG. 2 is shown a process flow diagram including several embodiments of the present invention. In process 201, a semiconductor process wafer comprising a low-K IMD layer is provided. In process 203, a via opening is formed through the IMD layer thickness including exposing an underlying conductive area. In process 205, a first supercritical fluid treatment is carried out according to preferred embodiments. In process 207, a resinous material layer is deposited to included filling the via opening. In process 209, a photoresist layer is formed over the resinous material layer and a trench opening is patterned. In process 211, a trench opening is etched into the IMD layer overlying and encompassing the via opening. In process 213, a second supercritical fluid treatment is carried out to remove the trench patterned photoresist and a remaining portion of the resinous plug layer according to preferred embodiments. In process 215, a third supercritical fluid treatment is carried out to lower the dielectric constant of the IMD layer including forming Si—O—Si bonds adjacent exposed IMD layer portions. In process 217, conventional process including barrier layer formation, metal backfilling and planarization steps are carried out to complete the formation of the dual damascene.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a damascene structure in a semiconductor device manufacturing process comprising the steps of:
  a dielectric layer on a substrate;
  providing a substrate comprising an uppermost first photoresist layer and a via opening extending through a thickness of a dielectric insulating layer to expose an underlying metal region;
  carrying out a first supercritical fluid treatment comprising supercritical carbon dioxide ($CO_2$) to remove the first photoresist layer;
  forming a resinous layer on the dielectric insulating layer to include filling the via opening;
  patterning a second photoresist layer on the resinous layer for etching a trench opening overlying the via opening;
  etching the trench opening; and,
  carrying out a second supercritical fluid treatment comprising supercritical $CO_2$ to remove the second photoresist layer and the resinous layer to form a dual damascene opening.

2. The method of claim 1, further comprising the step of carrying out a third superoritical fluid treatment comprising superoritical $CO_2$ and a bond forming additive for increasing a density of Si—O—Si bonds in the dielectric insulating layer.

3. The method of claim 2, wherein the bond forming additive comprises R—Si($CH_3$)$_x$H$_y$ containing groups, where R is an organic substituent and x+y=3.

4. The method of claim 3, wherein R comprises a chemical group selected from the group consisting of alkyls, hydroxyalkyls, phenyls, alkylphenyls, hydroxyalkylphenyls, alkanols, and amines.

5. The method of claim 2, wherein the bond forming additive is selected from the group consisting of alkyl amine silanes and alkyl amino silanes.

6. The method of claim 2, wherein the bond forming additive is selected from the group consisting of $(CH_3)_3$Si—NH—Si$(CH_3)_3$ and $(CH_3)_3$Si—$NH_2$.

7. The method of claim 1, wherein the first and second supercritical fluid treatments further comprise an additive of a metal corrosion inhibitor and a metal anti-oxidation agent.

8. The method of claim 7, wherein the metal corrosion inhibitor is selected from the group consisting of imidazole, tolytrizole, and thiourea.

9. The method of claim 7, wherein the metal anti-oxidation agent is selected from the group consisting of benzotriazole (BTA) and mercaptobenzothiazole (MBT).

10. The method of claim 9, wherein the co-solvent comprises a compound selected from the group consisting of acids, phenols, and amines.

11. The method of claim 9, wherein a co-solvent comprising a compound selected from the group consisting of ketones, halogenated hydrocarbons, sulfonic acids, carboxylic acids, pyrrolidones, glycol ethers, esters, and sulfur oxides is added to the first and second supercritical fluid treatments.

12. The method of claim 1, wherein the first and second supercritical fluid treatments further comprise an additive of a metal anti-oxidation agent.

13. The method of claim 1, wherein the first and second supercritical fluid treatments comprise a co-solvent for respectively removing the first and second photoresist layers.

14. The method of claim 1, wherein the dielectric insulating layer has a dielectric constant of less than about 3.0.

15. The method of claim 1, further comprising the steps of:
  lining the dual damascene opening with a barrier layer;
  backfilling the dual damascene opening with copper; and,
  carrying out a chemical mechanical polishing (CMP) process to remove a copper surface.

* * * * *